US012660705B2

(12) United States Patent
Lee et al.

(10) Patent No.: US 12,660,705 B2
(45) Date of Patent: Jun. 16, 2026

(54) SEMICONDUCTOR STRUCTURE AND MANUFACTURING METHOD THEREOF

(71) Applicant: UNITED MICROELECTRONICS CORP., Hsin-Chu City (TW)

(72) Inventors: Chiu-Te Lee, Hsinchu County (TW); Wen-Fang Lee, Hsinchu City (TW); Shan-Shi Huang, Hsinchu City (TW); Kuan-Chuan Chen, Taichung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 363 days.

(21) Appl. No.: 18/224,057

(22) Filed: Jul. 19, 2023

(65) Prior Publication Data

US 2024/0429220 A1     Dec. 26, 2024

(30) Foreign Application Priority Data

Jun. 26, 2023     (CN) ......................... 202310760806.X

(51) Int. Cl.
H01L 27/15 (2006.01)
H01L 29/167 (2006.01)
(Continued)

(52) U.S. Cl.
CPC ........ H10W 90/00 (2026.01); H10W 72/0198 (2026.01); H10W 72/932 (2026.01);
(Continued)

(58) Field of Classification Search
CPC ......... H01L 25/18; H01L 24/05; H01L 24/08; H01L 24/80; H01L 24/94; H01L 24/97;

H01L 25/50; H01L 2224/05555; H01L 2224/05647; H01L 2224/05684; H01L 2224/08145; H01L 2224/80357; H01L 2224/80895; H01L 2224/80896; H01L 2224/94; H01L 2224/97; H01L 2924/12041; H01L 25/167; H01L 25/0753; H01L 2224/48137; H01L 24/06; H01L 24/73; H01L 2224/16145; H01L 2224/16227; H01L 2224/05008; H01L 2224/0401; H01L 2224/0603; H01L 2224/16238; H01L 24/11; H01L 24/19; H01L 2224/0558; H01L 25/0756; H01L 2224/83203; H10H 20/018; H10H 20/85; H10H 20/0362; H10H 20/813; H10H 29/0364; H10H 20/01335; H10H 20/0137;

(Continued)

(56) References Cited

U.S. PATENT DOCUMENTS 11,158,690 B1     10/2021 Choi
11,410,606 B2     8/2022 Wacyk
(Continued)

*Primary Examiner* — Niki H Nguyen
(74) *Attorney, Agent, or Firm* — Winston Hsu

(57) ABSTRACT

The invention provides a semiconductor structure, which comprises a first silicon substrate with a display region and a driving region defined thereon, a circuit layer located on the first silicon substrate, a plurality of light emitting elements located on the display region of the first silicon substrate, a driving chip located on the driving region of the first silicon substrate and electrically connected with the circuit layer, and a second silicon substrate located on the driving chip.

19 Claims, 7 Drawing Sheets

(51) Int. Cl.

| | |
|---|---|
| *H01L 31/12* | (2006.01) |
| *H01L 33/00* | (2010.01) |
| *H10W 90/00* | (2026.01) |
| *H10W 72/00* | (2026.01) |
| *H10W 72/90* | (2026.01) |
| *H10W 80/00* | (2026.01) |

(52) U.S. Cl.
CPC ........ *H10W 72/941* (2026.01); *H10W 72/952* (2026.01); *H10W 80/312* (2026.01); *H10W 80/327* (2026.01); *H10W 90/792* (2026.01)

(58) Field of Classification Search
CPC .. H10H 29/24; H10H 29/8552; H10H 20/818; H10H 29/41; H10H 29/0362; H10H 29/852; H10H 29/962; H10H 20/013; H10H 29/011; H10H 29/37
See application file for complete search history.

(56) References Cited

U.S. PATENT DOCUMENTS

| | | | |
|---|---|---|---|
| 2017/0162636 A1* | 6/2017 | Park | H10K 59/50 |
| 2017/0193876 A1* | 7/2017 | Choi | H10K 59/131 |
| 2017/0346041 A1* | 11/2017 | Kim | H10K 59/8731 |
| 2022/0005860 A1* | 1/2022 | Hashiguchi | H10F 39/809 |
| 2022/0320055 A1* | 10/2022 | Choi | H10H 20/01 |
| 2022/0367434 A1* | 11/2022 | Suh | H01L 25/0753 |

\* cited by examiner

SEMICONDUCTOR STRUCTURE AND MANUFACTURING METHOD THEREOF

BACKGROUND OF THE INVENTION

1. Field of the Invention

The present invention relates to the field of semiconductors, in particular to a semiconductor structure in which two chips are bonded by hybrid bonding.

2. Description of the Prior Art

In the conventional technologies, when manufacturing a display panel, a display driver IC (DDI) needs to be connected to the display panel. Common chip packaging methods include chip on film (COF), chip on glass (COG) or chip on plastic (COP).

With the development of technology, the size of semiconductor devices is gradually shrinking and the fineness is getting higher and higher, and the above packaging methods are gradually insufficient to meet the needs of current technology. It is necessary to develop packaging methods with higher precision and smaller size to meet the actual use requirements.

SUMMARY OF THE INVENTION

The invention provides a semiconductor structure, which comprises a first silicon substrate with a display region and a driving region defined thereon, a circuit layer located on the first silicon substrate, a plurality of light emitting elements located on the display region of the first silicon substrate, a driving chip located on the driving region of the first silicon substrate and electrically connected with the circuit layer, and a second silicon substrate located on the driving chip.

The present invention further provides a method for manufacturing a semiconductor structure, the method includes providing a first wafer, forming a circuit layer and a plurality of light emitting elements on the first wafer, providing a second wafer, forming a plurality of driving chips on the second wafer, cutting the second wafer to form a plurality of second chips, each second chip includes a part of the second wafer and a driving chip, inverting and attaching the second chips to the first wafer, and cutting the first wafer to form a plurality of first dies, each first die comprises a part of the first wafer, a part of the circuit layer, a plurality of light emitting elements and a second chip.

The invention is characterized in that different chips made by two different nano-precision processes are combined, for example, it is suitable for the combination of a display driving chip and a light-emitting element, so that different elements (for example, a display driving IC and a light-emitting array) can be respectively formed by a suitable nano-process, the cost can be reduced and the quality of the elements can be improved. In addition, the two chips of the present invention are connected by hybrid bonding, so that the cost can be reduced and the component size can be greatly reduced at the same time.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
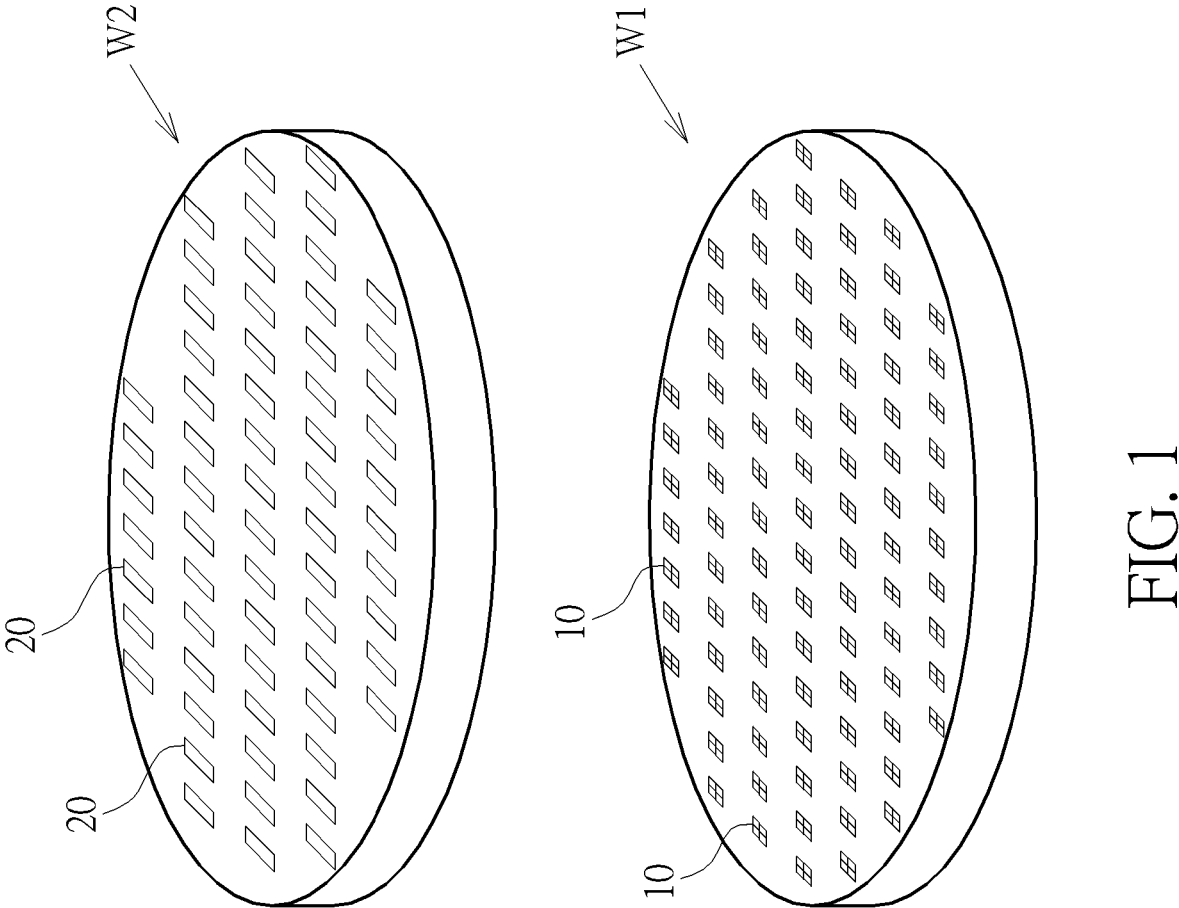
FIG. 1 is a schematic diagram showing a first wafer and a second wafer of the present invention.

Please refer to FIG. 1, first, a first wafer W1 and a second wafer W2 are provided, for example, the first wafer W2 and the second wafer W2 are silicon wafers, but not limited thereto. A plurality of first active elements 10 and a plurality of second active elements 20 are respectively formed on a first wafer W1 and a second wafer W2, that is, a plurality of first active elements 10 and a plurality of second active elements 20 are respectively formed on a silicon substrate. It is worth noting that the first active element 10 and the second active element 20 are formed by semiconductor processes with different nano-process accuracy. For example, the first active element 10 on the first wafer W1 can be an array of light-emitting devices in a plurality of displays, the light-emitting devices require a nanometer accuracy of about 80 nanometers (that is, they are formed by a process of 80 nanometers). The second active elements 20 on the second wafer W2 can be a plurality of display driver IC, or called driver chips. The display driver IC requires a higher nano-process accuracy, for example, about 22 nanometers (that is, it is formed by a 22-nanometer process), but the above-mentioned process accuracy or the types of components are only one example of the present invention, and the present invention is not limited to this.

Figure 2:
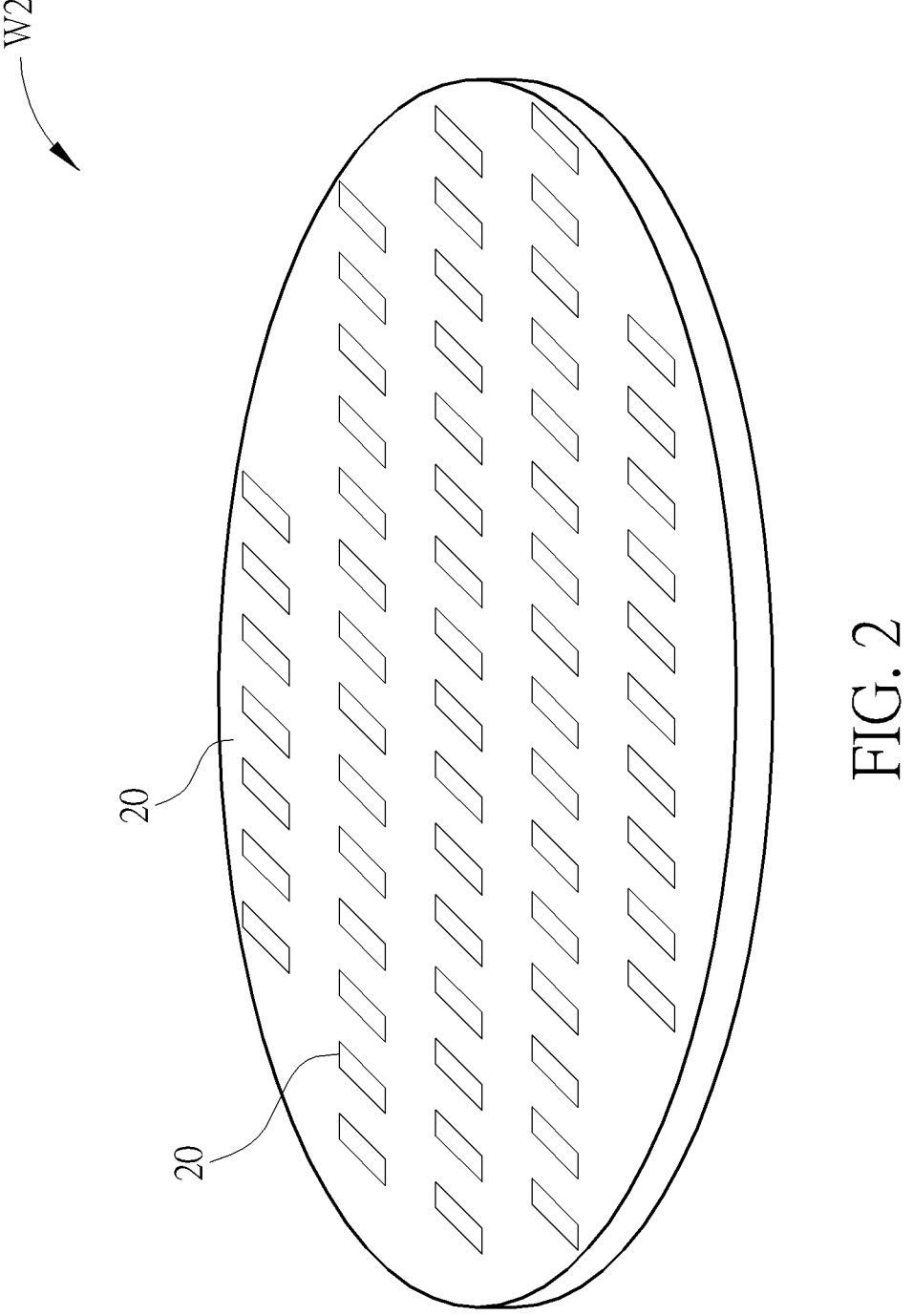
FIG. 2 shows a schematic diagram after thinning the second wafer.

Then, as shown in FIG. 2, in this embodiment, for example, the back surface of the second wafer W2 (i.e., the part of the silicon substrate) is thinned by chemical mechanical polishing (CMP). The overall thickness of the second wafer W2 is reduced to about 200 microns (m) to reduce the thickness of the second chip after subsequent cutting, but the actual thickness of the reduction can be adjusted as required.

Figure 3:
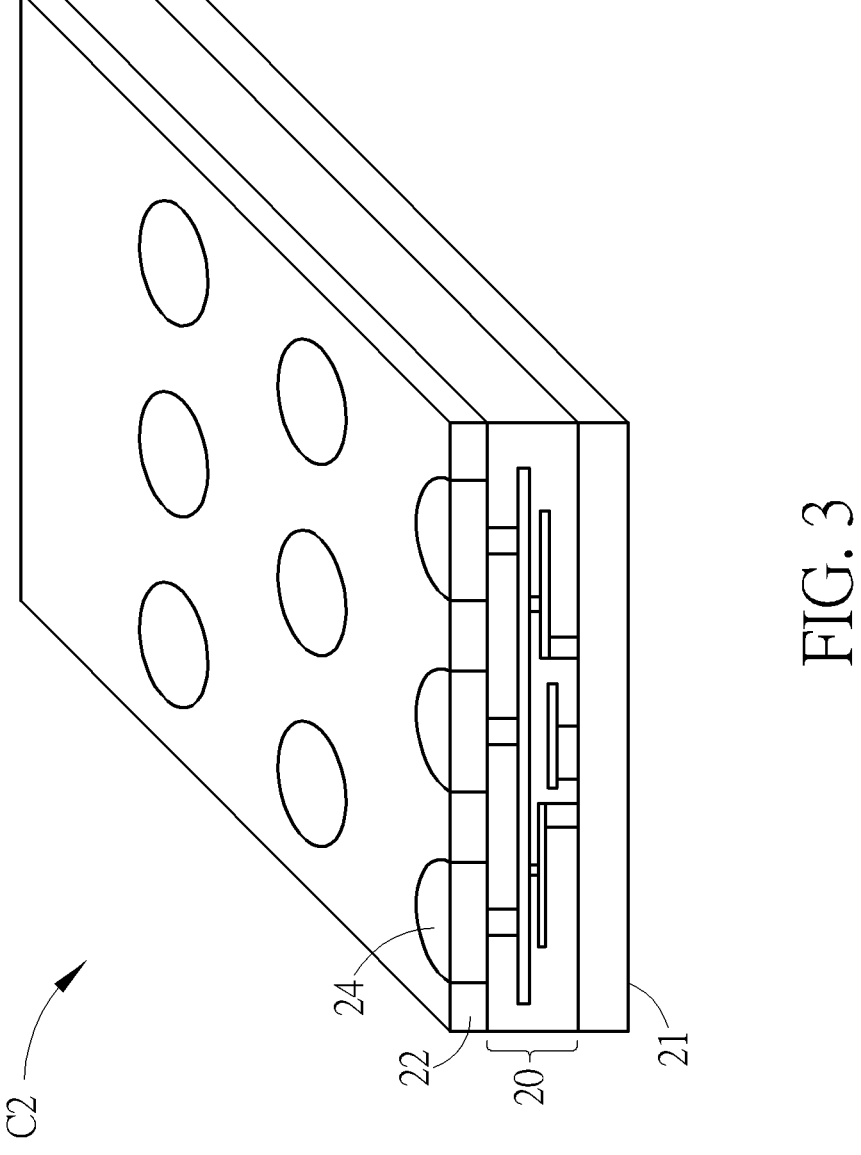
FIG. 3 shows a schematic diagram of forming a second chip after cutting a second wafer.

As shown in FIG. 3, the second wafer W2 is cut into a plurality of dies and packaged to form a plurality of second chips C2. The cut second chips C2 include a silicon substrate 21, and the silicon substrate 21 includes a plurality of second active elements 20 (after packaging, for example, as a driving chip). In addition, the second chips C2 also include a dielectric layer 22 and a hybrid bonding pad 24 on the top surface, which are used for the following steps. It is worth noting that the second chip C2 here comprises a structure composed of a silicon substrate 21, a driving chip (a plurality of second active elements) 20, a multi-layer circuit layer, a dielectric layer 22 and a hybrid bonding pad 24.

Figure 4:
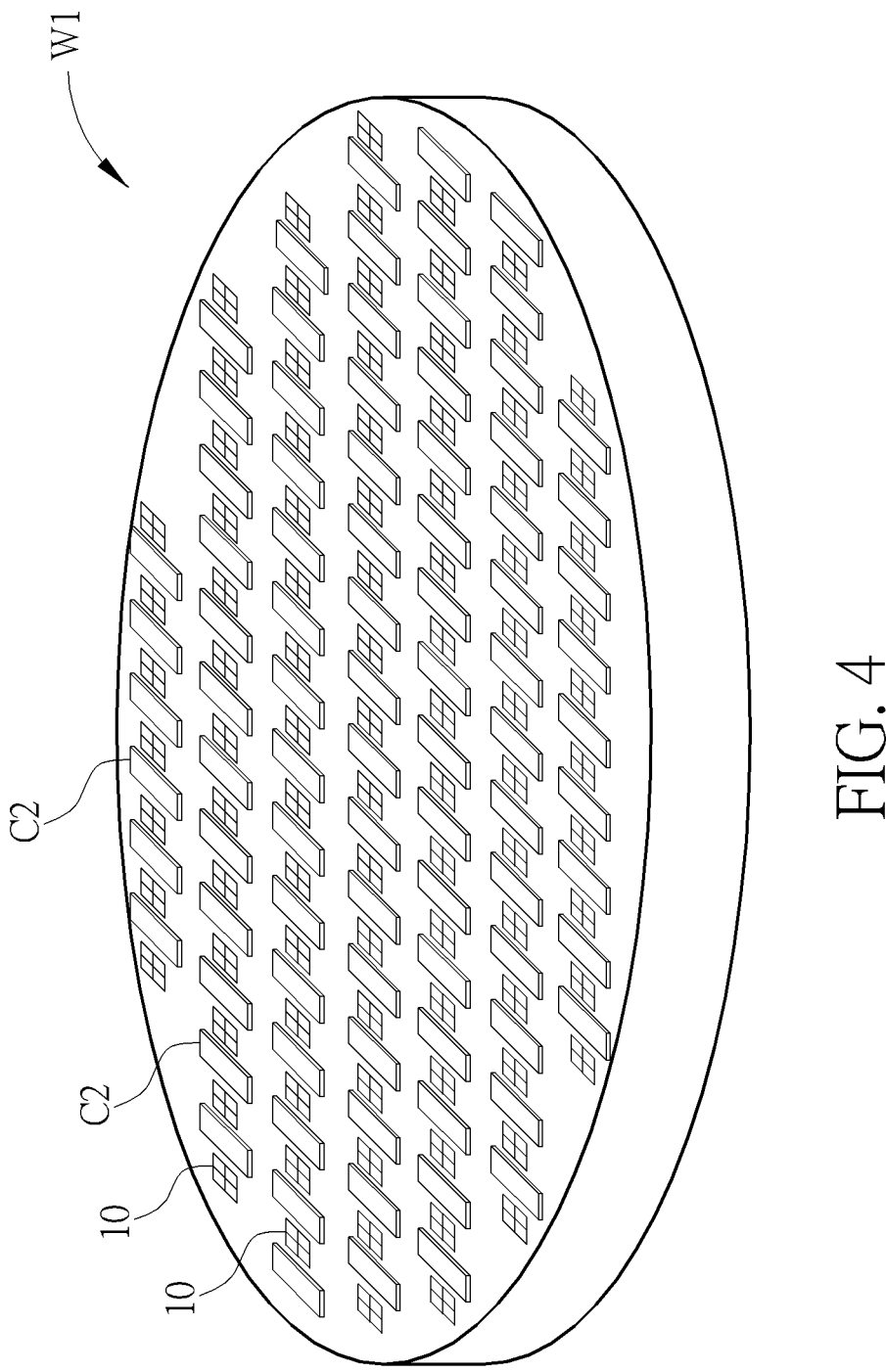
FIG. 4 shows a schematic diagram of mounting a second chip on a first wafer.

Referring to FIG. 4, after a plurality of first active elements 10 are formed on the first wafer W1, a dielectric layer (not shown) and a hybrid bonding pad (not shown) can also be formed on the surface of the first wafer W1, which is located next to the first active elements 10 (for example, a light emitting element array of a display). Next, a plurality of cut and packaged second chips C2 shown in FIG. 3 are mounted on the first wafer W1 by hybrid bonding. The dielectric layer on the first wafer W1 will be aligned and contacted with the dielectric layer 22 on the second chip C2, and the hybrid bonding pads on the first wafer W1 will also be aligned and contacted with the hybrid bonding pads 24 on the second chip C2.

Figure 5:
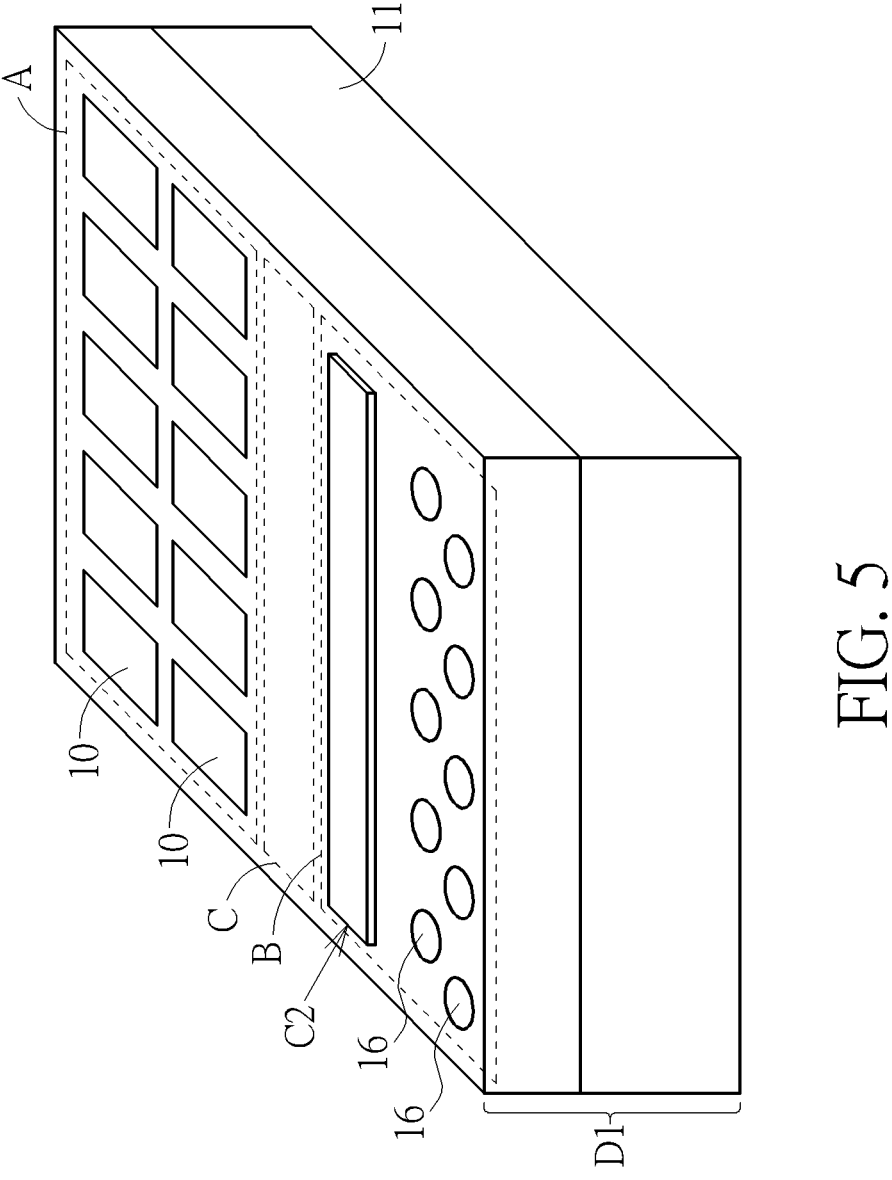
FIG. 5 is a schematic diagram showing the formation of a first die after cutting the first wafer.

As shown in FIG. 5, the first wafer W1 is then cut into a plurality of dies and defined as a plurality of first dies D1. It is worth noting that the area of the first die D1 is larger than the area of the second chip C2. More specifically, the cut first die D1 includes a silicon substrate 11, and the silicon substrate includes a plurality of circuit layers, a plurality of first active elements 10, the second chip C2, and may include some conductive pads 16 on the surface. The conductive pads 16, for example, are made of copper or tungsten, and are used for connecting the second chip C2 and providing its input signals. Here, the area where the first active element 10 is located can be defined as the display region A, and the areas of the second chip C2 and the conductive pad 16 can be defined as the driving region B. It is worth noting that the first active element 10 and the second chip C2 are not directly adjacent to each other, but are maintained between them, and there is a blank area C between them. The blank area C can avoid the manufacturing difficulties and electrical interference caused by the first active element 10 is too close to the second chip C2.

Figure 6:
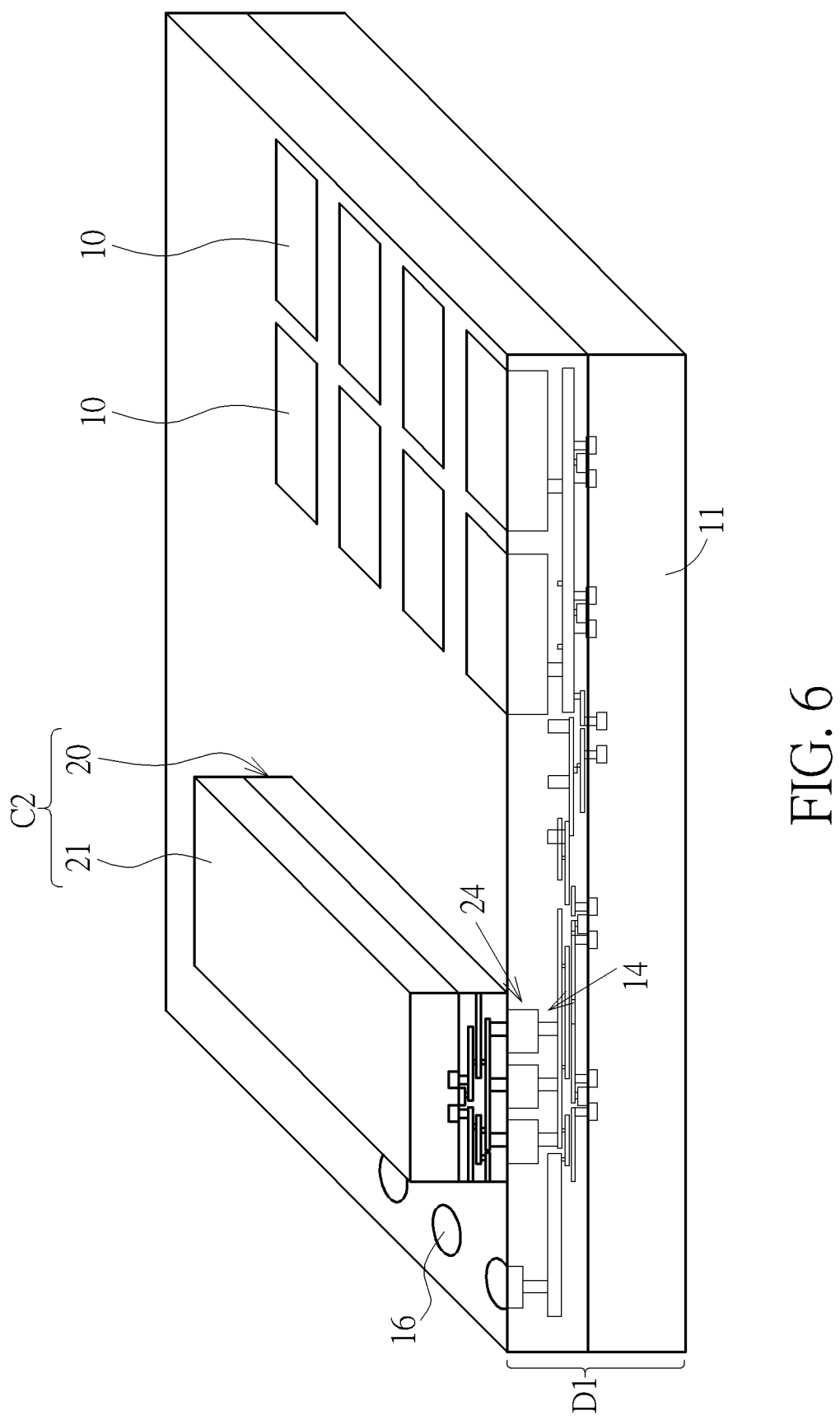
FIG. 6 shows a schematic view of the first die viewed from another angle.

Please refer to FIG. 6, which shows a schematic view of the first die viewed from another angle. As shown in FIG. 6, the first die D1 includes a plurality of circuit layers located and distributed in the first die D1, which are used to connect the first active element 10 with other devices (for example, to connect transistors below or to the second chip C2). Notably, after the circuit layer is formed, a dielectric layer 12 and a hybrid bonding pad 14 are formed on the circuit layer, and the first die D1 is bonded to the second die C2. It is also worth noting that the hybrid bonding pad 14 described here is different from the conductive pad 16, wherein the hybrid bonding pad 14 is used for directly connecting the second chip C2, while the conductive pad 16 is used for connecting other elements to transmit signals.

Figure 7:
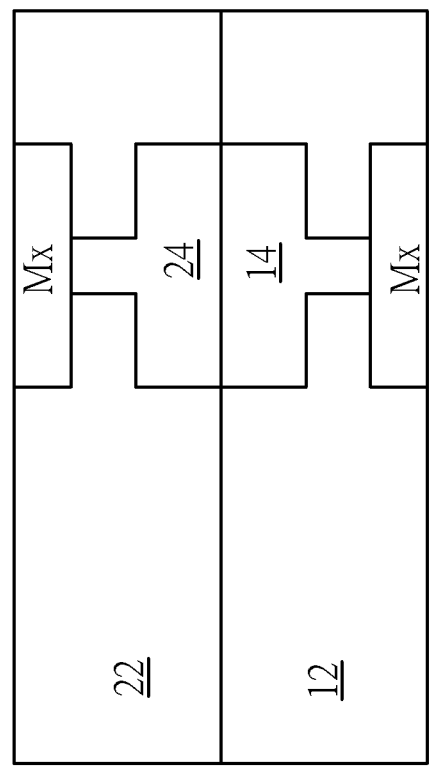
FIG. 7 is a schematic diagram showing the cross-sectional structure of the first die and the second chip at the junction of hybrid bonding interfaces.

FIG. 7 is a schematic diagram showing the cross-sectional structure of the first die and the second chip at the junction of heterogeneous bonding interfaces. As shown in FIG. 7, the first die D1 and the second chip C2 may include multiple circuit layers and multiple contact posts, respectively. In the present invention, the metal layers closest to the interface of the first die D1 and the second chip C2 are defined as Mx and My, respectively, except for their respective hybrid bonding pads. That is to say, after the first die D1 forms the metal layer Mx, the dielectric layer 12 and the hybrid bonding pads 14 are additionally formed. Similarly, after the metal layer My is formed on the second chip C2, the dielectric layer 22 and the hybrid bonding pad 24 are additionally formed, and then the hybrid bonding pad 14 is in direct contact with and electrically connected with the hybrid bonding pad 24, and the dielectric layer 12 is also in direct contact with the dielectric layer 22.

It is worth noting that in this embodiment, the first die D1 and the second chip C2 are connected by hybrid bonding. Compared with other kinds of packaging methods (such as solder packaging, cable packaging, etc.), hybrid bonding packaging can effectively improve the density of components and reduce the volume of components. In addition, in this embodiment, the first die D1 and the second chip C2 are electrically connected by a top-to-top contact method, so it is not necessary to form a through silicon via (TSV) structure, that is, it is not necessary to form a contact structure through the substrate, so that the electrical connection effect can be achieved.

Based on the above description and drawings, the present invention provides a semiconductor structure, which includes a first silicon substrate 11 with a display region A and a driving region B defined thereon, a circuit layer (i.e., a multi-layer circuit layer including a circuit layer Mx) located on the first silicon substrate 11, a plurality of light emitting elements (the first active elements 10) located on the display region A of the first silicon substrate 11, a driving chip (i.e., the second active device 20) is located on the driving area B of the first silicon substrate 11 and electrically connected to the circuit layer Mx, and a second silicon substrate 21 is located on the driving chip 20.

In some embodiments of the present invention, an area of the second silicon substrate 21 is smaller than an area of the first silicon substrate 11.

In some embodiments of the present invention, a thickness of the second silicon substrate 21 is less than a thickness of the first silicon substrate 11.

In some embodiments of the present invention, the top of the circuit layer further comprises a plurality of first hybrid bonding pads 14 located in the driving region B and a plurality of second hybrid bonding pads 24 located below the driving chip 20, wherein the first hybrid bonding pads 14 directly contact the second hybrid bonding pads 24.

In some embodiments of the present invention, a plurality of first hybrid bonding pads 14 are located in a first dielectric layer 12 +y of second hybrid bonding pads 24 are located in a second dielectric layer 22, the first dielectric layer 12 directly contacts the second dielectric layer 22.

In some embodiments of the present invention, the semiconductor structure does not include through silicon via (TSV).

In some embodiments of the present invention, the circuit layer Mx electrically connects a plurality of light emitting elements (the first active element 10) and the driving chip 20.

In some embodiments of the present invention, the plurality of light emitting elements comprise an array of light emitting diodes.

In some embodiments of the present invention, the first silicon substrate 11 is provided with at least one first active element 10, and the driving chip 20 is provided with at least one second active element (second active element 20), and the first active element 10 and the second active element 20 are formed with different nano-processing accuracy.

The invention also provides a method for manufacturing a semiconductor structure, which comprises the following steps: providing a first wafer W1, forming a circuit layer (the multi-layer circuit layer including Mx) and a plurality of light emitting elements 10 on the first wafer W1, providing a second wafer W2, forming a plurality of driving chips 20 on the second wafer W2, and cutting the second wafer W2 to form a plurality of second chips C2. Each second chip C2 includes a part of the second wafer (i.e., the silicon substrate 21) and a driving chip 20, the second chips C2 are inverted and attached to the first wafer W1, and the first wafer W1 is cut to form a plurality of first chips D1, wherein each first chip D1 includes a part of the first wafer (i.e., the silicon substrate 11), a part of circuit layers, a plurality of light emitting elements 10 and the second chips C2.

In some embodiments of the present invention, it further includes a thickness reduction step for the second wafer W2 to reduce the thickness of the second wafer W2.

In some embodiments of the present invention, an area of each second chip C2 is smaller than an area of the first die D1.

In some embodiments of the present invention, after the circuit layer is completed, a first dielectric layer 12 is further formed on top of the circuit layer, and a plurality of first hybrid bonding pads 14 are formed in the first dielectric layer 12.

In some embodiments of the present invention, after the driving chip 20 is completed, a second dielectric layer 22 is further formed on top of the driving chip 20, and a plurality of second hybrid bonding pads 14 are formed in the second dielectric layer.

In some embodiments of the present invention, after a plurality of second chips C2 are inverted and attached to the first wafer W1, the first hybrid bonding pad 14 directly contacts the second hybrid bonding pad 24.

In some embodiments of the present invention, the first dielectric layer 12 directly contacts the second dielectric layer 22 after a plurality of second chips C2 are inverted and attached to the first wafer W1.

In some embodiments of the present invention, the materials of the first wafer W1 and the second wafer W2 include silicon.

In some embodiments of the present invention, the step of manufacturing the driver chip 20 and the step of manufacturing the light-emitting device 10 have different nanometer process accuracy (for example, 22 nm process and 80 nm process, respectively, but not limited to this).

In the conventional technologies, if the light-emitting element and the driving IC of the display are formed in a multi-layer stacked manner, they need to be completed in the same precision process (for example, both are 22 nm processes). However, if the light-emitting element is also fabricated in the 22 nm process, it will increase the cost, and at the same time, because the process accuracy does not match the size of the device, it may also lead to a decline in quality.

The invention is characterized in that different chips made by two different nano-precision processes are combined, for example, it is suitable for the combination of a display driving chip and a light-emitting element, so that different elements (for example, a display driving IC and a light-emitting array) can be respectively formed by a suitable nano-process, the cost can be reduced and the quality of the elements can be improved. In addition, the two chips of the present invention are connected by hybrid bonding, so that the cost can be reduced and the component size can be greatly reduced at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
a first silicon substrate, a display region and a driving region are defined thereon;
a circuit layer located on the first silicon substrate;
a plurality of light emitting elements located on the display region of the first silicon substrate;
a driving chip located on the driving region of the first silicon substrate and electrically connected to the circuit layer; and
a second silicon substrate located on the driving chip.

2. The semiconductor structure according to claim 1, wherein an area of the second silicon substrate is smaller than an area of the first silicon substrate.

3. The semiconductor structure according to claim 1, wherein a thickness of the second silicon substrate is smaller than a thickness of the first silicon substrate.

4. The semiconductor structure according to claim 1, wherein a top of the circuit layer further comprises a plurality of first hybrid bonding pads located in the driving region and a plurality of second hybrid bonding pads located under the driving chip, wherein the first hybrid bonding pads directly contact the second hybrid bonding pads.

5. The semiconductor structure according to claim 4, wherein the first hybrid bonding pads are located in a first dielectric layer and the second hybrid bonding pads are located in a second dielectric layer, wherein the first dielectric layer directly contacts the second dielectric layer.

6. The semiconductor structure according to claim 1, wherein the semiconductor structure does not include any through silicon via (TSV).

7. The semiconductor structure according to claim 1, wherein the circuit layer electrically connects the plurality of light emitting elements and the driving chip.

8. The semiconductor structure according to claim 1, wherein the plurality of light emitting elements comprise a light emitting diode array.

9. The semiconductor structure according to claim 1, wherein the first silicon substrate is provided with at least one first active element, and the driving chip is provided with at least one second active element, and the first active element and the second active element are formed by different nano-process accuracy.

10. A manufacturing method of a semiconductor structure, comprising:
providing a first wafer;
forming a circuit layer and a plurality of light emitting elements on the first wafer;
providing a second wafer;
forming a plurality of driving chips on the second wafer;
cutting the second wafer to form a plurality of second chips, wherein each second chip comprises a part of the second wafer and a driving chip;
inverting the second chips and attaching them to the first wafer; and
cutting the first wafer to form a plurality of first dies, wherein each first die comprises a part of the first wafer, a part of the circuit layer, the plurality of light emitting elements and the second chip.

11. The method for manufacturing a semiconductor structure according to claim 10, further comprising a step of thinning the second wafer to reduce a thickness of the second wafer.

12. The method for manufacturing a semiconductor structure according to claim 10, wherein an area of each of the second chips is smaller than an area of the first die.

13. The method for manufacturing a semiconductor structure according to claim 10, further comprising:

forming a first dielectric layer on a top of the circuit layer after the circuit layer is completed; and forming a plurality of first hybrid bonding pads in the first dielectric layer.

14. The method for manufacturing a semiconductor structure according to claim 13, further comprising:

forming a second dielectric layer on a top of the driving chip after the driving chip is completed; and forming a plurality of second hybrid bonding pads in the second dielectric layer.

15. The manufacturing method of a semiconductor structure according to claim 14, wherein after the second chips are inverted and attached to the first wafer, the first hybrid bonding pad directly contacts the second hybrid bonding pad.

16. The method for manufacturing a semiconductor structure according to claim 15, wherein after the second chips are inverted and attached to the first wafer, the first dielectric layer directly contacts the second dielectric layer.

17. The method for manufacturing a semiconductor structure according to claim 10, wherein the step of forming the semiconductor structure does not include forming any through silicon via (TSV).

18. The method for manufacturing a semiconductor structure according to claim 10, wherein the materials of the first wafer and the second wafer comprise silicon.

19. The method for manufacturing a semiconductor structure according to claim 10, wherein the nano-process accuracy of the step of manufacturing the driving chip is different from the nano-process accuracy of the step of manufacturing the plurality of light emitting elements.

* * * * *